United States Patent
Shinogi et al.

[11] Patent Number: 5,889,311
[45] Date of Patent: Mar. 30, 1999

[54] SEMICONDUCTOR ACCELERATION SENSOR

[75] Inventors: Masataka Shinogi; Yutaka Saitoh; Kenji Kato, all of Chiba, Japan

[73] Assignee: Seiko Instruments R&D Center Inc., Japan

[21] Appl. No.: 807,179

[22] Filed: Feb. 27, 1997

[30] Foreign Application Priority Data

Feb. 27, 1996 [JP] Japan .................................. 8-040128

[51] Int. Cl.⁶ .................................................. H01L 29/82
[52] U.S. Cl. ........................ 257/417; 257/415; 257/418; 438/52
[58] Field of Search .................................. 257/415, 417, 257/418, 420; 438/52

[56] References Cited

U.S. PATENT DOCUMENTS

| | | | |
|---|---|---|---|
| 5,231,879 | 8/1993 | Yamamoto | 73/517 R |
| 5,243,861 | 9/1993 | Kloeck et al. | 73/517 R |
| 5,260,596 | 11/1993 | Dunn et al. | 257/414 |
| 5,408,112 | 4/1995 | Tai et al. | 257/254 |
| 5,539,236 | 7/1996 | Kurtz et al. | 257/415 |

*Primary Examiner*—Mahshid D. Saadat
*Assistant Examiner*—Allan R. Wilson
*Attorney, Agent, or Firm*—Adams & Wilks

[57] ABSTRACT

A semiconductor device comprises a semiconductor acceleration sensor having a cuboid-shaped cantilever cut from a semiconductor wafer, a detecting device disposed on the cantilever for detecting a displacement of the cantilever due to an acceleration force applied to the cantilever, and a supporter for supporting and fixing the cantilever at one end thereof.

17 Claims, 10 Drawing Sheets

FIG. 1
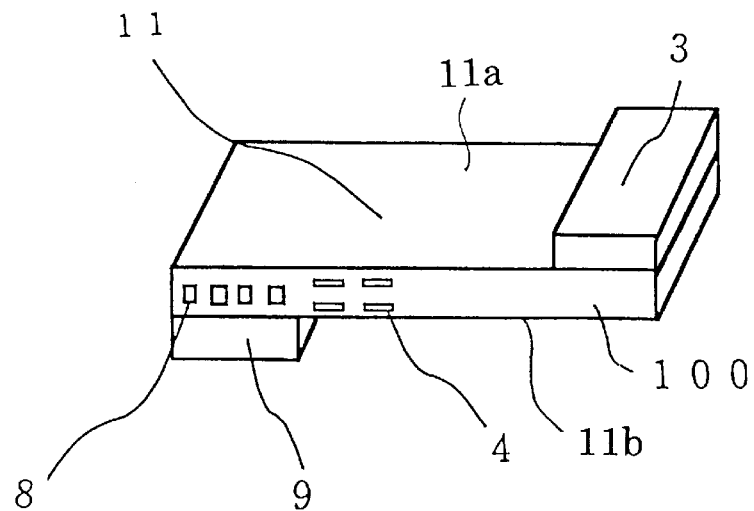
FIG. 2A
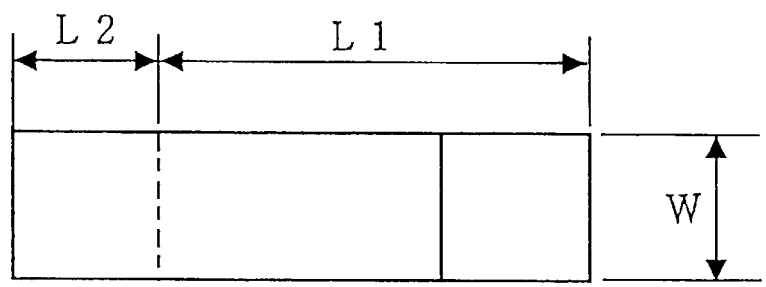
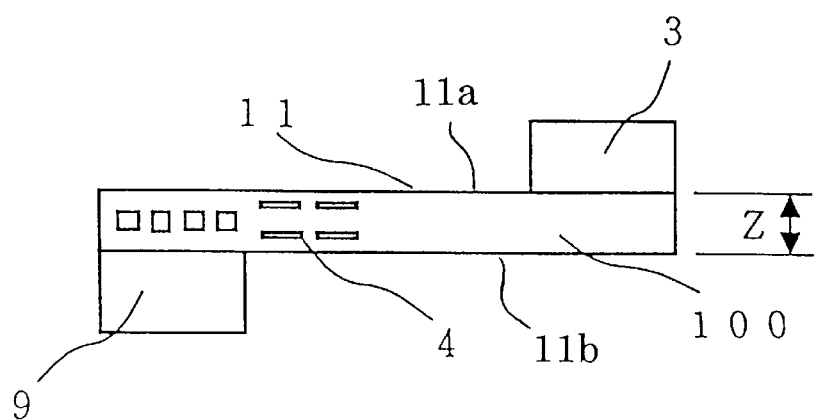
FIG. 2B

FIG. 7A
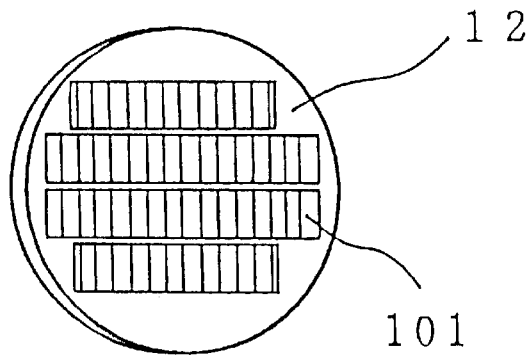
FIG. 7B
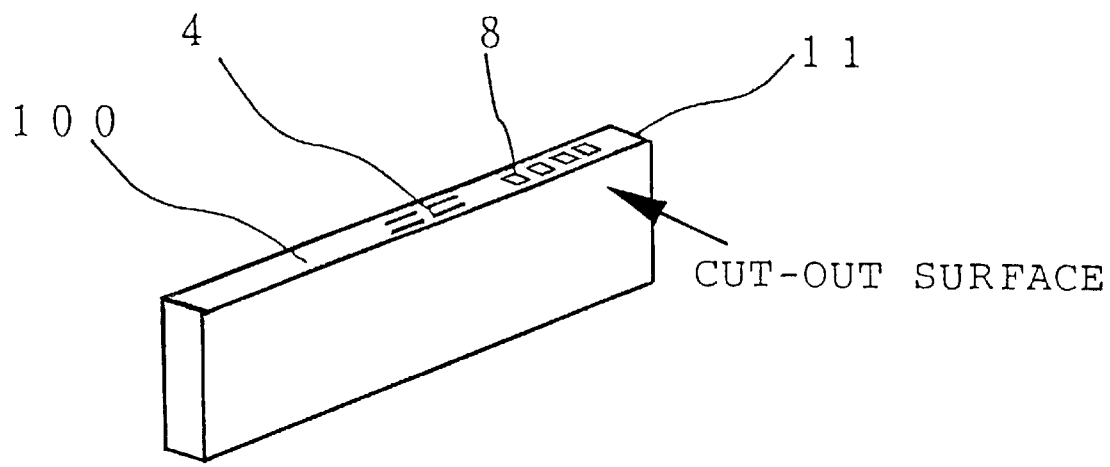
CUT-OUT SURFACE
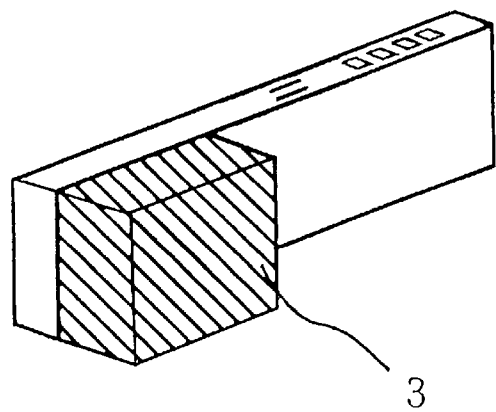
FIG. 7C

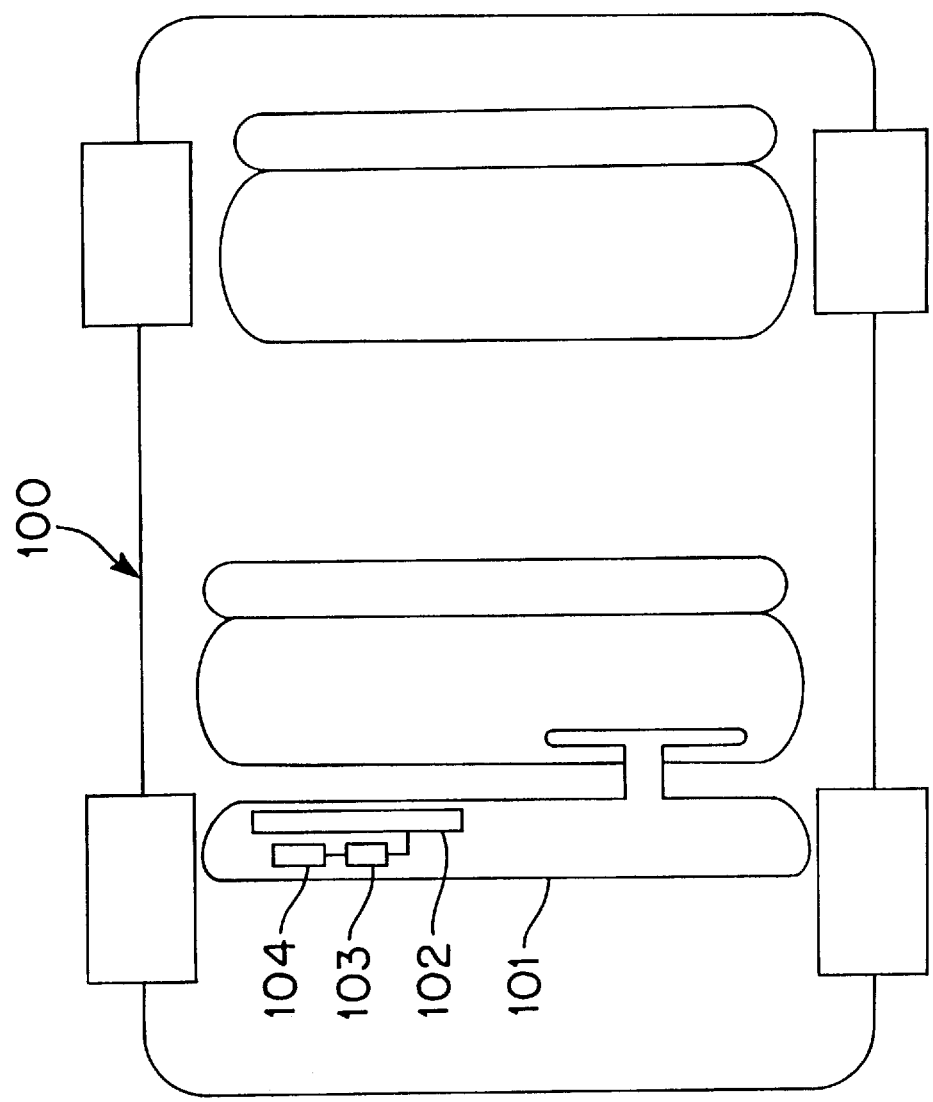

SEMICONDUCTOR ACCELERATION SENSOR

BACKGROUND OF THE INVENTION

1. Field of the Invention

The present invention relates particularly to an acceleration sensor and a pressure sensor of a semiconductor device for transducing displacement into electrical signals by utilizing a piezo-resistance effect of semiconductor crystal such as silicon.

2. Description of the Related Background Art

The recent development of micro-machining technology has made it possible to fabricate a semiconductor acceleration sensor by forming a thin film on a semiconductor wafer and by etching it (see IEEE Transactions on Electron Devices, Vol. ED-26, No. 12, Dec. 1979 for example).

FIG. 3 show a semiconductor acceleration sensor fabricated by means of a prior art micro-machining technology, wherein FIG. 3A is a plan view thereof and FIG. 3B is a section view. A silicon base 1 is etched to form a cantilever 2 and a weight 3. Here, the cantilever 2 is formed to be thinner than other parts by means of etching and is deformed by acceleration in the direction of an arrow in FIG. 3B. The deformation of the cantilever 2 is detected by a piezo-resistance effect of a diffused resistor 4a formed on the upper surface of the cantilever 2 and the acceleration is found by comparing with a diffused resistor 4b. Here, the diffused resistors 4a and 4b are connected to a high concentrate diffusion domain 5 and output terminals 8. Further, an upper stopper 6 and a lower stopper 7 are disposed and the whole structure is disposed on a ceramic substrate 10 in order to prevent the cantilever 2 from being destroyed.

FIG. 4A shows a semiconductor acceleration sensor fabricated by means of micro-machining disclosed in Japanese Patent Laid-Open No. Hei. 1-302167, wherein a groove 35 is formed by means of etching near a supporter 9 of the cantilever 2 to provide a thin portion 36. Diffused resistors 4c, 4d, 4e and 4f which compose a bridge circuit 50 are disposed on the upper surface of the sensor. The diffused resistors 4c and 4f function as reference resistors and are disposed on the upper part of the supporter 9. The diffused resistors 4d and 4e function as variable resistors for detecting the deformation of the thin portion 36 and are disposed orthogonally to the reference resistors. FIG. 4B shows a detection circuit of the device shown in FIG. 4A.

Although it is necessary to form the thin portion 36 shown in FIG. 4A in the prior art semiconductor acceleration sensor in order to enhance the detection sensitivity, the mechanical strength of the whole drops due to that.

While the thickness of the thin portion 36 is related to the detection sensitivity, it is necessary to strictly control the composition, temperature and agitating conditions of etching fluid and a number of manufacturing processes increase such as formation of pattern of masking in order to obtain a uniform thickness because the thin portion 36 is formed by means of etching.

Further, because the diffused resistors 4a and 4b are disposed on the upper surface of the acceleration sensor and the weight 3 is formed as shown in FIG. 3A, an area of the upper surface of the acceleration sensor becomes large. Therefore, a number of sensors taken out of one silicon substrate is limited and it has been difficult to lower the production cost for example. Further, a predetermined value has to be kept for a width of the cantilever 2, i.e. a width in the depth direction from the front side of the figure, in order to keep a certain strength of the thin portion 36 also in the acceleration sensor in FIG. 4A. Accordingly, the area of the upper surface of the sensor cannot be reduced similarly to the acceleration sensor in FIG. 3A. Therefore, a number of sensors taken out of a semiconductor wafer is also limited and it is difficult to lower the cost.

Still more, because the diffused resistors 4 for detecting the acceleration are placed on the surface of the acceleration sensor which receives the acceleration, it has been necessary to dispose the diffused resistors 4 such that a difference of values of resistance of the reference resistors disposed on the supporter 9 and the variable resistors becomes large.

Accordingly, the present invention has been devised to solve the aforementioned problems and has been intended to manufacture a large number of sensors readily from one semiconductor wafer to obtain low cost semiconductor acceleration sensors and pressure sensors.

SUMMARY OF THE INVENTION

In order to solve the aforementioned problems, diffused resistors 4, i.e. strain sensitive sections, are disposed on the side of a sensor in order to manufacture a large number of sensors from one semiconductor wafer. The provision of the means for detecting displacement on the side of the sensor allows to obtain high precision and low cost sensors without using the etching process, i.e. with less manufacturing processes.

Further, it allows to supply a semiconductor device containing a semiconductor acceleration sensor with a good yield.

BRIEF DESCRIPTION OF DRAWINGS

FIG. 1 is a perspective view showing a structure of an inventive semiconductor acceleration sensor;

FIG. 2A is a plan view showing a structure of a semiconductor acceleration sensor and FIG. 2B is a side view thereof;

FIGS. 7A through 7C are drawings showing a process for manufacturing the inventive semiconductor acceleration sensor;

FIG. 13 is an explanatory drawing showing the inventive semiconductor acceleration sensor incorporated in a motor vehicle for activating inflation of an air bag.

DESCRIPTION OF THE PREFERRED EMBODIMENTS

Figure 3A:
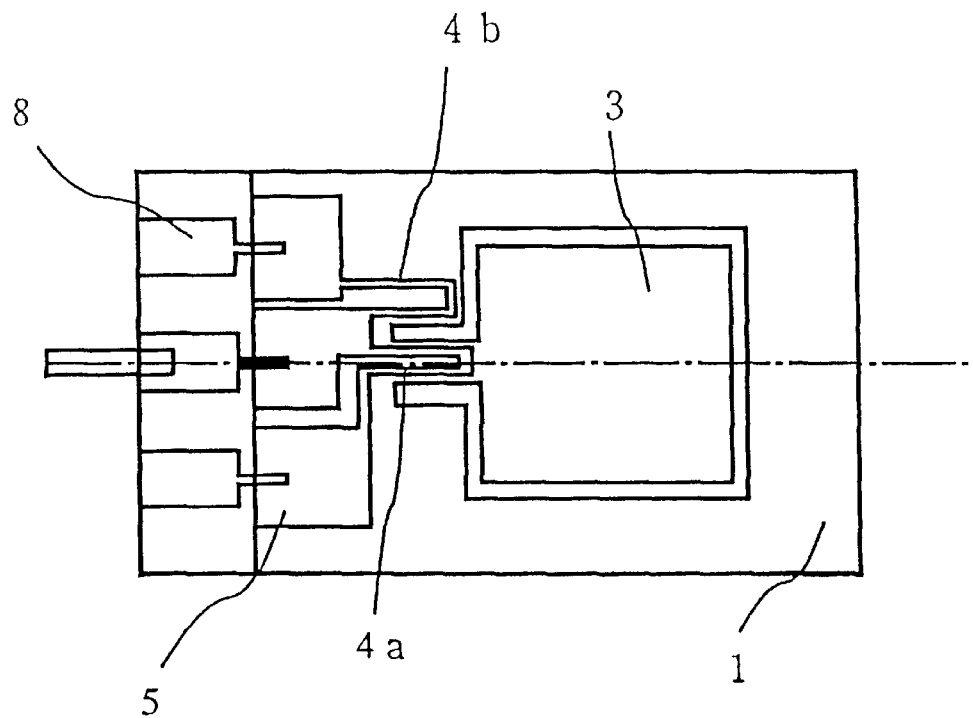
FIG. 3A is a plan view showing a structure of a prior art semiconductor acceleration sensor and FIG. 3B is a section view thereof.

A concrete embodiment of the present invention will be explained below based on FIG. 1.

FIG. 1 is a perspective view of a semiconductor acceleration sensor of the present invention.

A semiconductor substrate 11 having an upper surface 11a, a lower surface 11b and side surface 100 is formed into a cuboid and diffused resistors 4 and output terminals 8 which are electrically connected with the diffused resistors 4 are disposed on the side surface 100 which is one of the surfaces of the cubiod. Here, it is also possible to dispose an amplifier circuit, a temperature compensating circuit and a filtering circuit on the side surface 100 of the semiconductor substrate 11. A weight 3 is integrally connected to the upper surface 11a of the semiconductor substrate 11 at a free end therof. A supporter 9 is integrally connected to the lower surface 11b of the semiconductor substrate 11 at another end thereof opposite the free end for supporting the semiconductor substrate.

The semiconductor substrate 11 has the diffused resistors 4 composing a bridge circuit 50 on one side thereof and has the cuboid structure.

This cuboid structure is fabricated by cutting out a semiconductor wafer 12 having the diffused resistors 4. The cut-out element has a surface which is a thickness of the semiconductor wafer 12 and which is orthogonal to the surface of the cuboid having the diffused resistors 4.

After the cut, the surface of the semiconductor wafer 12 on which the diffused resistors 4 are formed corresponds to the side face 100.

FIGS. 2A is a plan view and FIG. 2B is a side view of the semiconductor acceleration sensor described above. Although it is possible to form the semiconductor substrate 11 into various shapes, it is effective to be cuboid because it can be taken out readily from the semiconductor wafer 12. Further, the detection sensitivity may be enhanced by reducing a thickness Z of the semiconductor substrate 11 less than a width thereof. It is noted that a portion L2 where the supporter 9 is fixed with the semiconductor substrate 11 is a supporting portion and a portion L1 which is not fixed and is rockable is a sensor portion: those portions will be referred as such hereinafter.

Figure 5A:
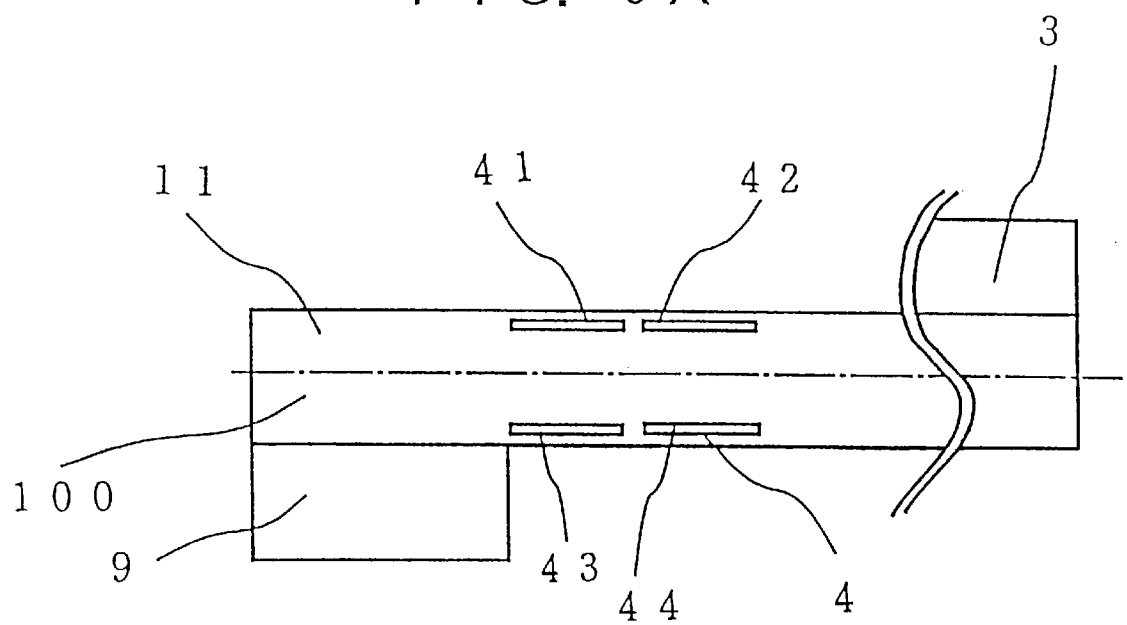
FIG. 5A is a front view showing a structure of an inventive semiconductor acceleration sensor and FIG. 5B is a bridge circuit.

FIG. 5A shows a configuration of the diffused resistors 4 according to the present embodiment. It is preferable to compose the bridge circuit 50 by the diffused resistors 41, 42, 43 and 44. Further, it is preferable to dispose those diffused resistors by dividing as diffused resistors 41 and 42 near the upper surface of the semiconductor substrate 11 and as the diffused resistors 43 and 44 near the lower surface. Then, tensile stress and compression stress may be detected by the diffused resistors 4 near the upper surface and the diffused resistors 4 near the lower surface. Further, it is preferable to dispose the diffused resistors 41, 42, 43 and 44 such that their longitudinal direction orient in parallel with the longitudinal direction of the semiconductor substrate 11, i.e. in the horizontal direction of the page of FIG. 5A.

A size and a positional relation of the device used in the present embodiment will be explained with reference to the drawings. The device is formed by using silicon having a shape of 9 mm in length (L1=6 mm, L2=3 mm), 0.6 mm in width W and 0.1 mm in height Z as shown in FIGS. 2A and 2B. The width W is the thickness of the silicon substrate. Here, the diffused resistors 4 are composed of the diffused resistors 41 and 42 near the upper surface of the side 100 of the semiconductor substrate 11 and the diffused resistors 43 and 44 near the lower surface as shown in FIG. 5A, each having 0.3 mm in length and 0.01 mm in width. Then, the left edges of the diffused resistors 41 and 42 coincide with the right edge of the supporter 9. A distance between the surface of the semiconductor substrate 11 and the center of the diffused resistors 4 in the direction of height of the semiconductor substrate is 0.015 mm.

Figure 5B:
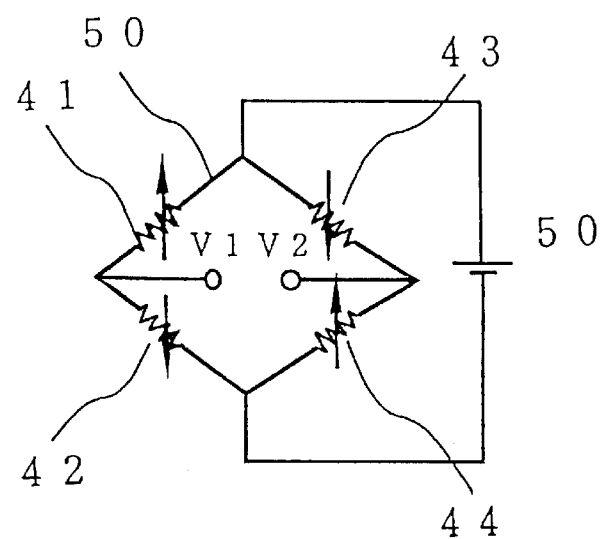

FIG. 5B shows the bridge circuit 50 at this time.

The reason why the configuration of the diffused resistors of the present embodiment exerts a high sensitivity will be explained below.

Figure 3B:
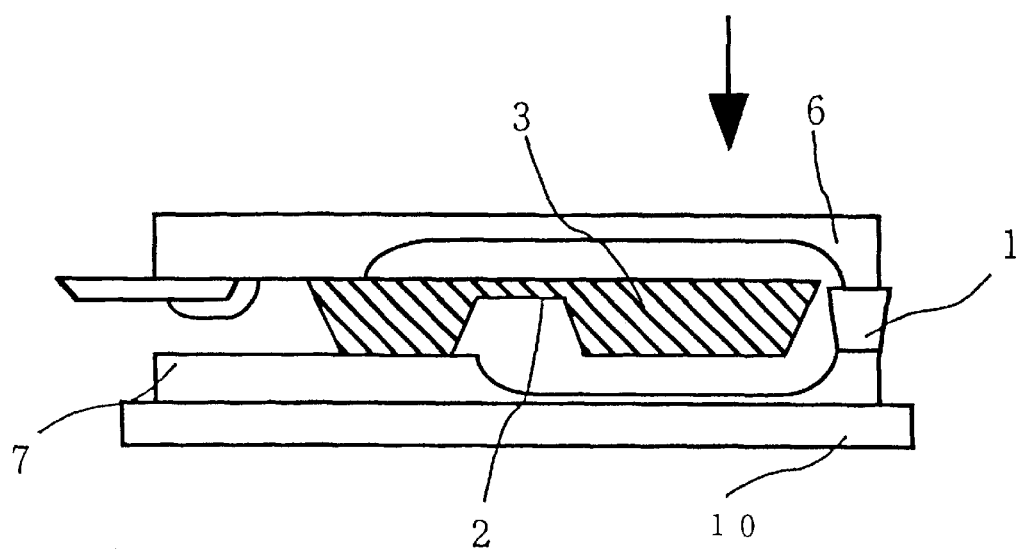
Figure 4A:
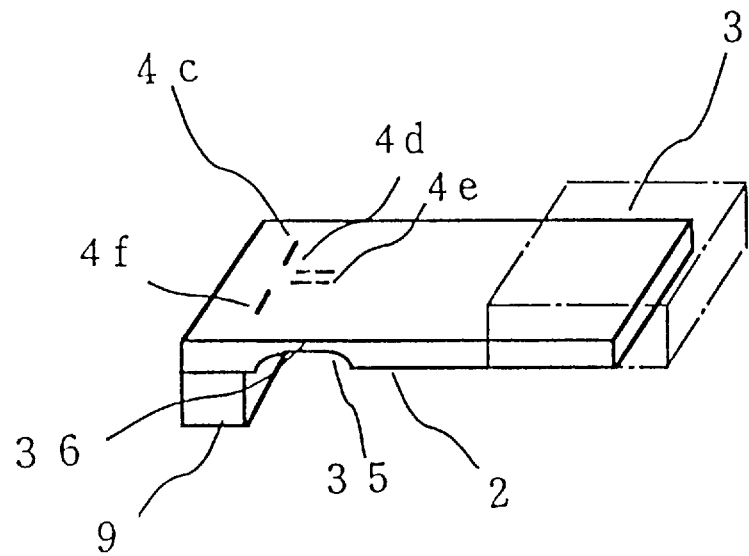
FIG. 4A is a perspective view of a prior art semiconductor acceleration sensor and FIG. 4B is a bridge circuit.
Figure 4B:
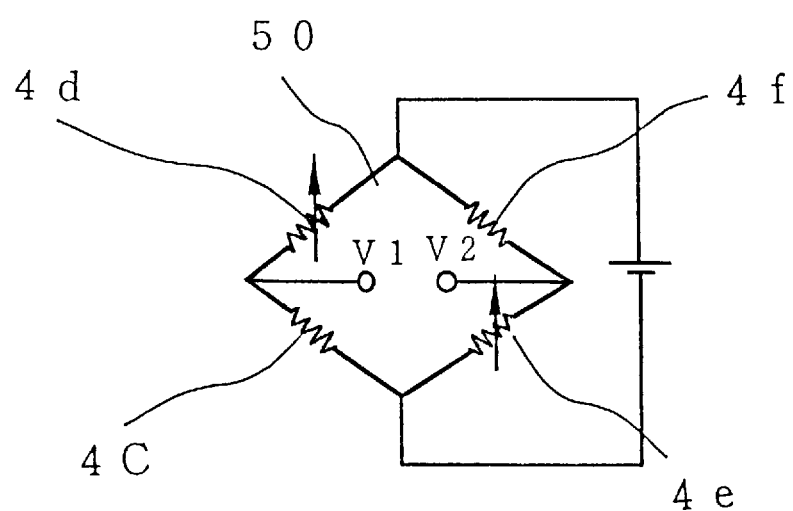

When the diffused resistors 4 are disposed on the plane of the prior art semiconductor acceleration sensor shown in FIG. 3B, the bridge circuit 50 is formed by setting the diffused resistors 4c and 4f as the reference resistors and the diffused resistors 4d and 4e as the measuring resistors. When the diffused resistors 4c and 4f are R, the diffused resistors 4d and 4e may be represented as R+ΔR. Assuming an output at this time as VOUT, it may be expressed by the following expressions:

$$V1 = (R/2R+\Delta R)V \tag{1}$$

$$V2 = (R+\Delta R/2R+\Delta R)V \tag{2}$$

$$VOUT = V2 - V1 = (\Delta R/2R+\Delta R)V \tag{3}$$

Assuming a value of resistance caused by a compression stress as R+ΔR and a value of resistance caused by a tensile stress as R−ΔR in the electrical circuit of the present invention, the same may be expressed by the following expressions:

$$V1 = (R-\Delta R/2R)V \tag{4}$$

$$V2 = (R+\Delta R/2R)V \tag{5}$$

$$VOUT = V2 - V1 = (\Delta R/R)V \tag{6}$$

When ΔR is a very small value and is negligible, the inventive electrical circuit exerts an output twice of that of the prior art circuit as seen from the expressions (3) and (6). From the above reason, the diffused resistors 4 are disposed so as to increase the sensitivity by utilizing the tensile stress and compression stress.

A method for manufacturing the inventive semiconductor acceleration sensor will be described below by using a flow diagram in FIG. 7.

In manufacturing the semiconductor acceleration sensor, the diffused resistors 4 and the output terminals 8 are patterned on the surface of the semiconductor wafer 12, (FIG. 7A) the semiconductor wafer 12 is cut such that the diffused resistors 4 and the output terminals 8 hold the same plane to obtain the semiconductor substrate 11 (FIG. 7B) and the semiconductor substrate 11 is bonded with the supporter 9 and the weight 3 (FIG. 7C).

Here, beside the diffused resistors 4 and the output terminals 8, an amplifier circuit, a filter circuit and a temperature compensating circuit may be patterned on the surface of the semiconductor wafer 12. Further, it is possible to cut the semiconductor wafer 12 by dicing. The dicing is carried out by creating lines for scribing on the outside portion of the semiconductor substrate 11 and by cutting it based on the scribe lines. Acceleration sensor semiconductor elements 101 are laid out within the semiconductor wafer 12.

In the present embodiment, low acceleration elements have been fabricated. The low acceleration refers to 1 to 2

G G=9.8 m/S$^2$. A length of the whole element is 9 mm (L1=6 mm, L2=3 mm), a width W is 0.6 mm and a height Z is 0.1 mm. The acceleration sensor for low acceleration according to the present invention can be used for detecting earthquakes, for virtual reality and the like.

The element in FIG. 7B is cut out from the semiconductor wafer 12 by dicing as an individual element as shown in FIG. 7B. FIG. 7B shows a cut-out surface.

Although it is possible to cut out the semiconductor substrate 11 in normal dicing carried out by using water as cutting water, it has been carried out by the following method in order to improve the precision.

Figure 8:
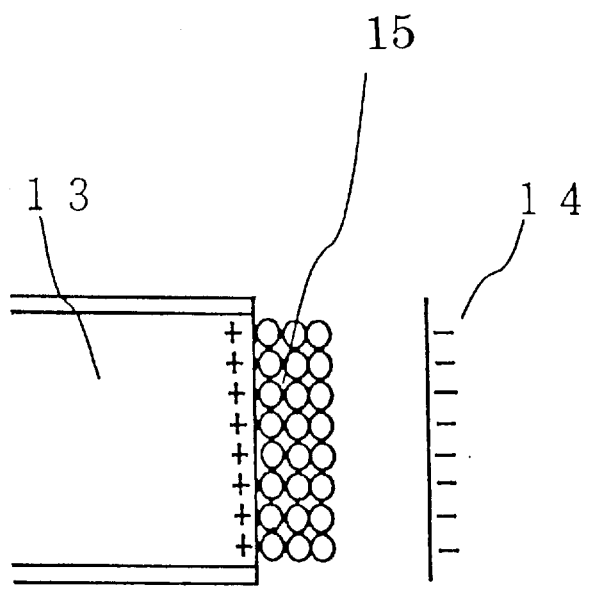
FIG. 8 is a drawing for explaining an electrophoretic phenomenon according to one embodiment of the present invention.

During use of cutting elements in the process for cutting the semiconductor wafer 12, there have been problems that chipping is caused in the elements and the diffused resistors 4 are destroyed when a cutting resistance to the elements becomes large and that they are not finished within a desirable size. In order to deal with such problems, an electrophoretic phenomenon of superfine abrasive grain was utilized. Its principle will now be explained. Superfine silica grains 15 are used for cutting fluid. The superfine silica grains 15 are given minus a change within an alkaline fluid. Therefore, the silica grains 15 migrate toward an anode 13 when an electric field acts on that. It will not go to a cathode 14. FIG. 8 shows this phenomenon. The superfine silica grains 15 exist at the charged electrode of the anode 13. The silica grains 15, i.e. colloidal silica, cause an electrical adsorption phenomenon on the surface of the electrode. When an adsorption layer is formed continuously on the surface of the electrode during when the electric field acts. That is, the adsorption layer of the superfine silica grains may be readily formed and it becomes possible to work with less cutting resistance by creating the electric field on a blade 16 (FIG. 9).

Figure 9:
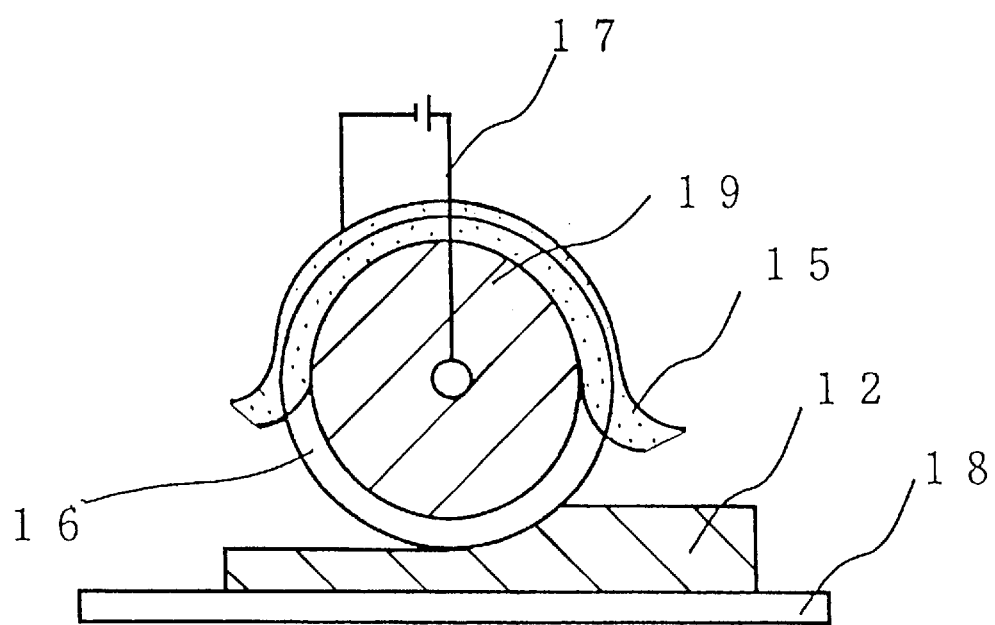
FIG. 9 is a drawing for explaining a dicing equipment according to one embodiment of the present invention.

FIG. 9 shows a structure of an equipment used in the present embodiment.

The equipment comprises, in addition to a dicing equipment conventionally used, a mechanism for supplying an abrasive to the dicing blade 16 and a power source 17 for applying electrolysis to the dicing blade 16. A silica layer is created on the dicing blade 16 by supplying the colloidal silica, i.e. the cutting member, to the dicing blade 16 and by applying electrolysis to the DC power source 17. The semiconductor wafer 12 is thus placed on a chuck 18 and is cut by the dicing equipment.

Figure 10:
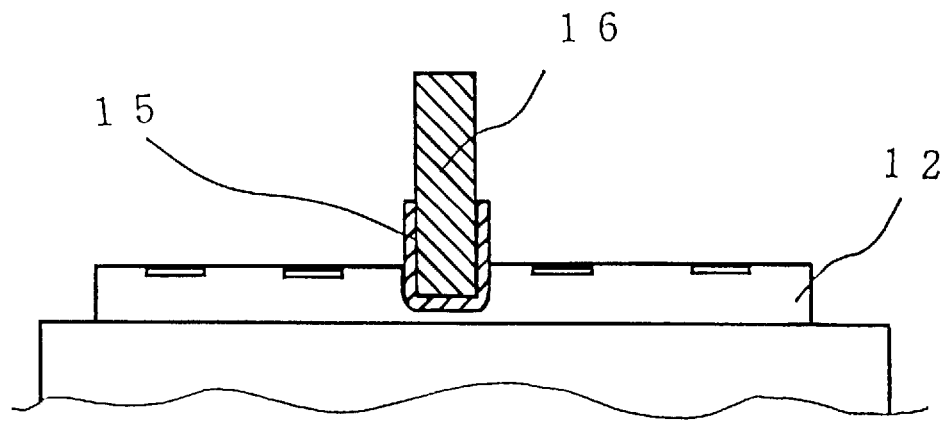
FIG. 10 is a drawing for explaining a dicing method according to one embodiment of the present invention.

A cutting operation carried out by using the present embodiment will be explained with reference to FIG. 10. The dicing blade 16 drops on the fixed semiconductor wafer 12 and contacts with it. At this time, the superfine silica grains 15 are supplied as abrasive to the dicing blade 16. Then the silica grains 15 are adsorbed to the dicing blade 16. The grain size of the superfine silica grains is 10 nm to 20 nm and the silica in these grain size adsorbs on the dicing blade 16 which is charged with the anode 13. The semiconductor wafer 12, i.e. a work piece, may be worked very finely by cutting it by this adsorption layer.

When elements are cut out in the above-mentioned size in the present embodiment, an amount of chipping is improved to 2 micron from an amount of chipping of 10 micron in the conventional dicing. Thereby, elements maybe supplied stably without causing disconnection of wires or destruction of diffusion layers and with a good yield.

Figure 12:
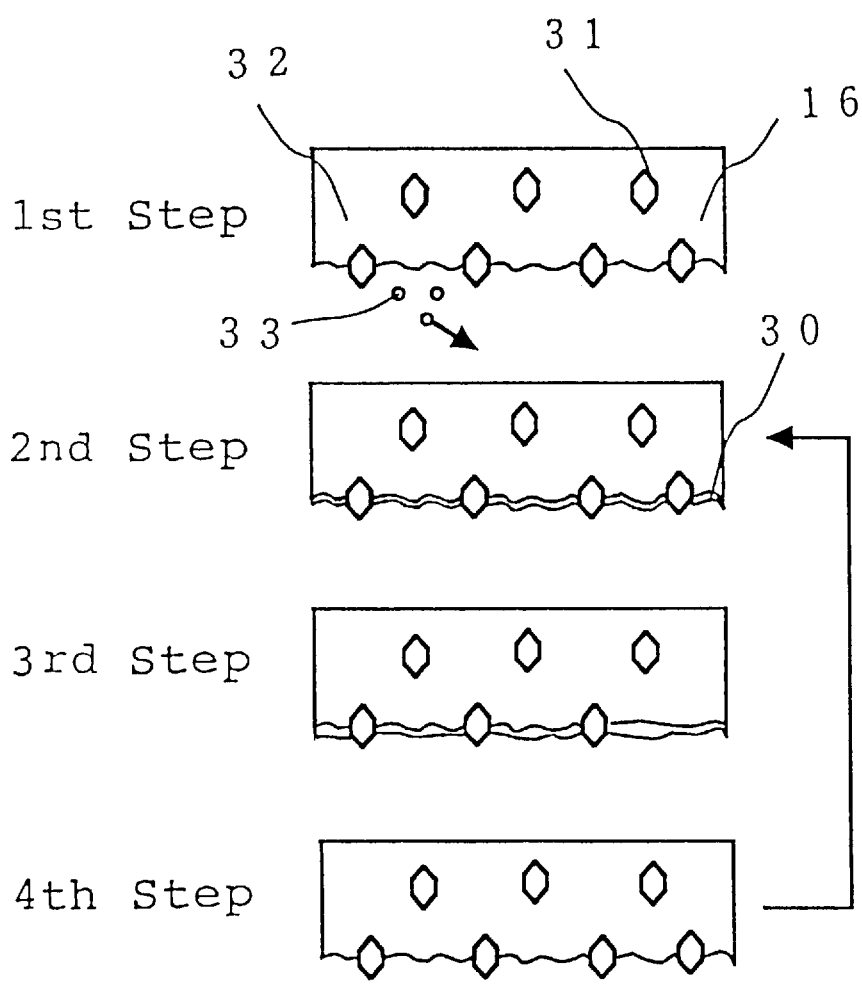
FIG. 12 is an explanatory drawing for explaining an electrolytic in-process of the present invention.

Further, as a method for reducing the amount of chipping, an electrolysis is applied to the dicing blade 16 having diamond particles by using cast iron for a bond member 32. Along with the electrolysis of the bond member, a non-conductive coating film 30 is formed on a surface of grindstone, elusion stops and abrasive grains project constantly. This process will be explained by using FIG. 12. The electrolysis is applied to the dicing blade 16 in Step 1. Then, cast iron, i.e. the bond member, of the dicing blade 16 eludes as iron ions 33. After the elusion, oxidation is started and the non-conductive coating film 30 is formed on the surface of the dicing blade 16 (Step 2). The diamond particles project out of the dicing blade 16. The cutting is started in this state. When the cutting is continued, the diamond particles 31 are de-bonded and the non-conductive coating film 30 is removed gradually. Due to that, the cutting environment gets worse. Here, the bond member 32 eludes by applying electrolysis again (Step 3). Then, the non-conductive coating film 30 is formed (return to Step 2). Steps 3 and 4 are repeated from Step 2 to advance the cutting. This method is called electrolytic in-process.

Figure 11:
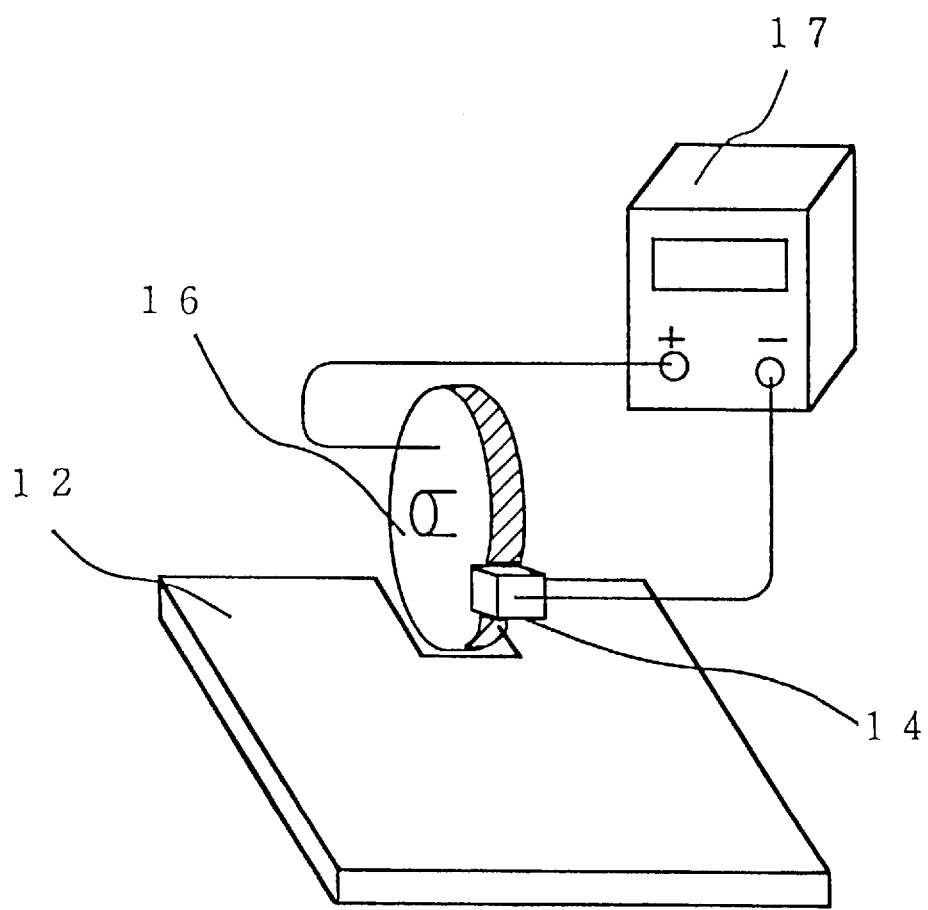
FIG. 11 is a drawing for explaining a dicing method according to one embodiment of the present invention.

A structure of the equipment at this time will be explained with reference to FIG. 11.

The equipment comprises a structure for applying electrolysis to the dicing blade 16, a cathode attachment 14 near the dicing blade 16 and a structure for applying the electrolysis to the dicing blade 16 by the DC power source 17. The semiconductor wafer 12 is cut by this kind of structure.

In the present embodiment, a fixing dicing tape whose adhesion is softened by irradiating an ultraviolet ray is used as a method for fixing the semiconductor wafer 12, i.e. the work piece. Thereby, it may be readily released or steadily fixed.

The above-mentioned method allowed to take out elements which are less chipped by cutting by means of the dicing equipment and which has less work affected layer.

Further, in the manufacturing method, the weight 3 is provided at one end of the semiconductor substrate 11 as shown in FIG. 7C in order to increase the detection sensitivity of the acceleration sensor. Metal or silicon may be used for the weight 3. Then, the weight 3 and the supporter 9 are fixed to the semiconductor substrate 11. The supporter 9 may be also fixed to a supporting substrate 10 beforehand. The weight 3 of 30 mg is fixed in the present embodiment. Because the position where the weight 3 is fixed, i.e. the position of gravity, is very important in the present embodiment, it was carried out by a method of finding the position of gravity easily by applying adhesive solution near the position of gravity of the weight 3 beforehand.

The structure composed of the semiconductor substrate 11, the weight 3 and the supporter 9 is fixed to the substrate 10 for supporting and outputting to the outside and the output terminals 8 of the semiconductor substrate 11 are connected with the substrate 10 by connecting wires. Here, an anisotropic conductive film (ACF) 40 was used in order to connect the output terminals 8 of the semiconductor substrate with the substrate 10 (FIG. 6C). The anisotropic conductive film is very convenient in crossing at right angles.

Figure 6A:
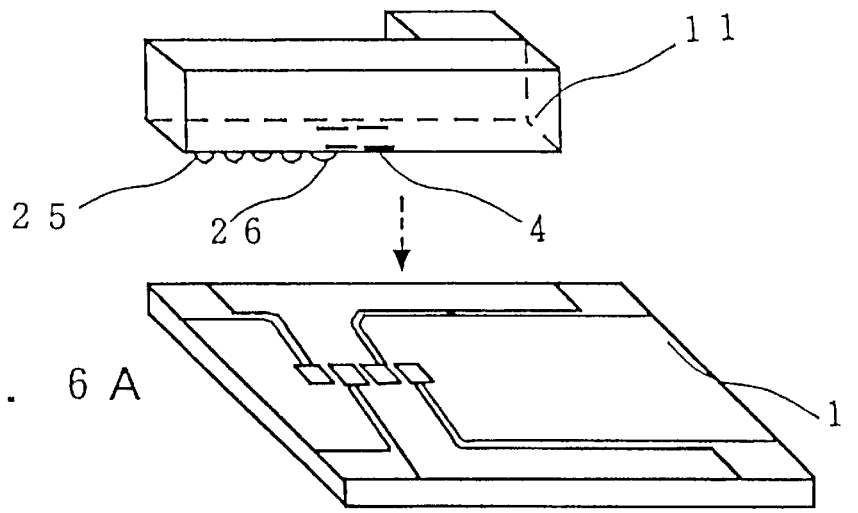
FIGS. 6A through 6C are drawings for explaining an inventive fixing method.

FIG. 6 shows another structural example. FIG. 6A shows a case when the semiconductor substrate 11 is fixed directly to the supporting substrate 10 to assure conduction together. Bumps 25 are formed at the output terminals 8 of the semiconductor. substrate 11. The side of the bumps 25 is faced to the supporting substrate and the bumps 25 of the semiconductor substrate 11 are contacted to the terminals of the supporting substrate 10. Then, the bumps 25 are melted by reflow to fix to the supporting substrate 10. It is more preferable to create fixing bumps 25 near the diffused resistors 4 to fix with the supporting substrate 10 in order to obtain better sensitivity. This method also allowed to obtain satisfactory values characteristically. FIG. 6A shows a bonding state at this time. The bumps 25 and the supporting substrate 10 are fixed as shown in the figure by contacting the bumps 25 to the supporting substrate 10 and by melting them. The fixing bumps 26 are used for the purpose other than the conduction because it is necessary to firmly fix the nearby diffused resistors.

Figure 6B:
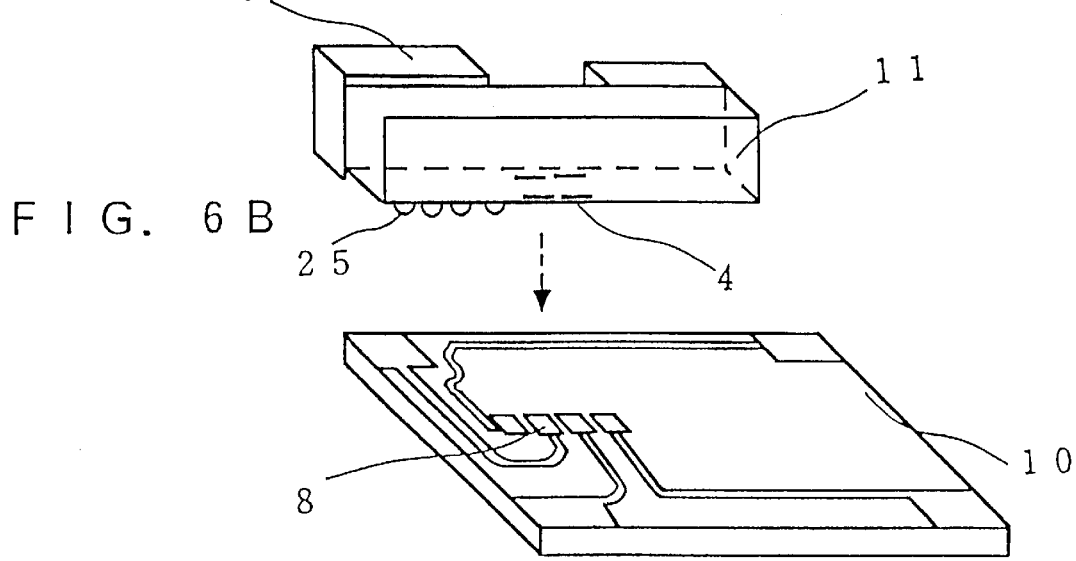
Figure 6C:
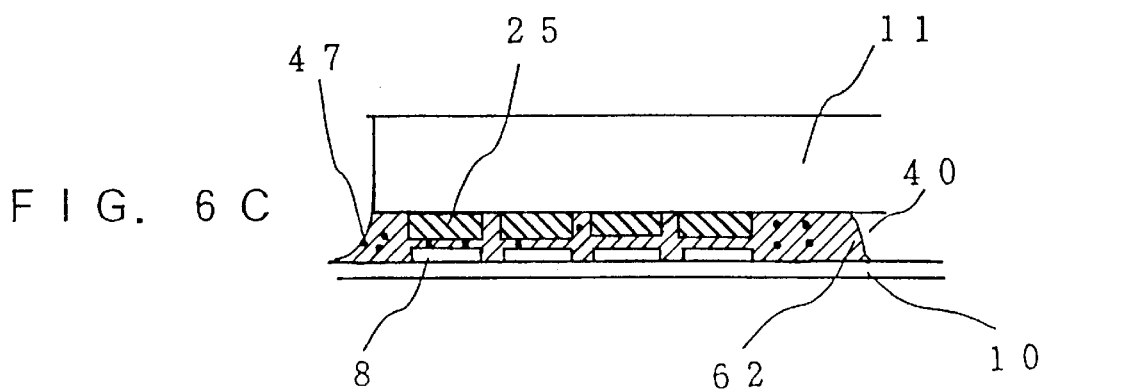

In FIG. 6B, a method of fixing the supporter 9 beforehand, of fixing the supporter 9 with the supporting substrate 10 and of conducting by means of the bumps 25 of the semiconductor substrate 11 has been adopted.

FIG. 6C shows a bonding method using the anisotropic conductive film 40. The anisotropic conductive film 40 contains small conductive particles 42 dispersed within adhesive 41. As shown in FIG. 6C, the particles are pinched between electrodes by thermocompression bonding, thus becoming electrically conductive, the insulation between the adjoining electrodes is kept and the mechanical bonding is carried out by hardening of the adhesive 41 in the same time. This method allows to obtain the conductivity of the bump 25 and the output terminals 8 via the conductive particles.

In the semiconductor acceleration sensor of the present embodiment, an output of 5 mV of voltage was obtained by providing the weight 3 of 30 mg. This value is a good characteristic as an output voltage not amplified. Further, as for a multi-axes sensitivity, it was 2% of a full scale value. This good multi-axes sensitivity is caused by the structure of the semiconductor substrate 11. A length of the sensor section is 6 mm and a width thereof, i.e. the thickness of the semiconductor wafer 12, is 0.6 mm. A thickness of the sensor section, i.e. a feed pitch distance of the dicing equipment, is 0.1 mm. This pitch distance of 0.1 mm is a value obtained by taking a yield such as spill of elements due to dicing into consideration. Here, while a width of the semiconductor substrate 11 is 0.6 mm, the thickness of the semiconductor substrate 11 is 0.1 mm, i.e. about ⅙ of the former. This structure allows to realize an element having no multi-axes sensitivity. Further, the configuration of the diffused resistors 4 of the present embodiment less influences the multi-axes sensitivity because a difference of displacement for the four diffused resistors is small.

Although the diffused resistors 4 are disposed only on one side in the structure described above, the diffused resistors 4 may be disposed on the both sides.

The processes described above allows to realize the structure in which the semiconductor substrate 11 which can be the sensor, the weight 3 and the supporter 9 are provided on the supporting substrate. Here, these are provided in a package as a sensor. At this time, silicon oil for protecting the sensor may be concealed.

Because the semiconductor device including the inventive semiconductor acceleration sensor is not formed so as to have a thin detection section and a draw-down like the prior art device, it shows excellent characteristics also to shock resistance. When the semiconductor device including the inventive semiconductor acceleration sensor was mounted in a car and was used as a sensor for actuating an air bag for protecting human life when the car collides, predetermined characteristics were obtained and it was within a fully usable range.

FIG. 13 shows the inventive semiconductor acceleration sensor 104 embodied in a motor vehicle, for example, a car 100, for activating inflation of an air bag. The car 100 has a dashboard 101 in which are mounted an inflatable air bag 102, a controller 103 and the semiconductor acceleration sensor 104. In use, when the semiconductor acceleration sensor 104 senses a deceleration (negative acceleration) above a preselected rate, such as when the car 100 impacts another car or object, the sensor 104 outputs a signal to the controller 103, which processes the sensor output signal and activates the inflation of the air bag 102.

The semiconductor acceleration sensor 104 is smaller than conventional air bag sensors and thus can be readily incorporated into the dashboard of a motor vehicle. Moreover, because the sensor 104 does not have a narrow width section as in the case of the conventional semiconductor acceleration sensor shown in FIGS. 3A and 3B, the sensor 104 is not likely to be damaged during normal operation of the vehicle and is able to accurately and reliably produce an output signal in the event of a collision or other impact.

The present invention has the following effects by the foregoing construction described above:

1) Because the semiconductor acceleration sensor holding the diffused resistor section is flat on the front and back and the diffused resistor section is not thin, the device may be fabricated readily. It requires no complex process and has a strong shock resistance.
2) Because no thin portion is required in the diffused resistor section, it requires less production time, leading to the manufacturing reduction of the cost.
3) Devices having good precision may be supplied.
4) Because a large number of acceleration semiconductor substrates may be obtained from a semiconductor wafer, low cost acceleration sensors may be supplied.
5) Because compression stress and tensile stress are detected in the same time, accurate devices may be supplied.

What is claimed:

1. A semiconductor device having a semiconductor acceleration sensor, comprising:
 a cuboid-shaped cantilever cut from a semiconductor wafer and having a strain sensitive section;
 a supporter for supporting the cuboid-shaped cantilever; and
 means for fixing at least one edge of the cuboid-shaped cantilever
 wherein the strain sensitive section is disposed on a first surface of the cuboid-shared cantilever, and the supporter is disposed on a second surface of the cuboid-shaded cantilever extending generally orthogonal to the first surface.

2. A semiconductor device having a semiconductor acceleration sensor according to claim 1; wherein the strain sensitive section comprises a bridge circuit.

3. A semiconductor device having a semiconductor acceleration sensor according to claim 2; wherein the bridge circuit has diffused resistors.

4. A semiconductor device having a semiconductor acceleration sensor according to claim 3; wherein the diffused resistors of the bridge circuit are disposed at an outer periphery portion of a surface of the cuboid-shaved cantilever, the surface having the diffused resistors being orthogonal to a surface corresponding to a thickness of the semiconductor wafer.

5. A semiconductor device having a semiconductor acceleration sensor according to claim 4; wherein a first pair of the diffused resistors are disposed on a portion of the cuboid-shaped cantilever receiving a positive acceleration and a second pair of the diffused resistors are disposed on a portion of the cuboid-shaped cantilever receiving a negative acceleration.

6. A semiconductor device having a semiconductor acceleration sensor according to claim 4; wherein the diffused resistors are disposed on a portion of the cuboid-shared cantilever receiving a positive acceleration and on a portion of the cuboid-shaved cantilever receiving a negative acceleration.

7. A semiconductor device having a semiconductor acceleration sensor according to claim 4; wherein the diffused resistors include diffused resistors for detecting compression stress and diffused resistors for detecting tensile stress.

8. A semiconductor device having a semiconductor acceleration sensor according to claim 1; wherein the diffused resistors are formed on a surface of the cuboid-shared cantilever and extend along a length of the cuboid-shaved cantilever.

9. A semiconductor device having a semiconductor acceleration sensor according to claim 1; further comprising a weight disposed on a third surface of the cuboid-shaped cantilever extending generally orthogonal to the first surface.

10. A semiconductor device comprising: a semiconductor acceleration sensor having a cantilever having a uniform thickness, the cantilever having a first surface, a second surface opposite the first surface and at least one side surface disposed generally orthogonal to the first and second surfaces, a supporter disposed on the first surface of the cantilever for supporting and fixing the cantilever, and a detecting device disposed on the side surface of the cantilever for detecting a displacement of the cantilever due to an acceleration force applied thereto.

11. A semiconductor device according to claim 10; wherein the cantilever comprises a cuboid-shaped semiconductor substrate.

12. A semiconductor device according to claim 10; wherein the detecting device comprises a plurality of diffused resistors.

13. A semiconductor device according to claim 10; further comprising a weight disposed at a free end of the cantilever.

14. A semiconductor device having a semiconductor acceleration sensor according to claim 10; further comprising a weight disposed on the second surface of the cantilever at a free end thereof.

15. A semiconductor acceleration sensor comprising: a silicon semiconductor substrate having a uniform thickness, the silicon semiconductor substrate having a first surface, a second surface opposite the first surface, and at least one side surface disposed generally orthogonal to the first and second surfaces; a supporter disposed on the first surface for supporting the silicon semiconductor substrate at one end thereof; and detecting means disposed on the side surface for detecting a displacement of the silicon semiconductor substrate due to an acceleration force applied to the silicon semiconductor substrate.

16. A semiconductor acceleration sensor according to claim 15; further comprising a weight disposed on the second surface of the silicon semiconductor substrate at a free end thereof opposite the end supported by the supporter.

17. A semiconductor acceleration sensor according to claim 15; wherein the silicon semiconductor substrate is generally cuboid-shaped.

* * * * *